(12) United States Patent
Huang et al.

(10) Patent No.: US 9,502,602 B2
(45) Date of Patent: Nov. 22, 2016

(54) STRUCTURE OF HIGH ELECTRON MOBILITY LIGHT EMITTING TRANSISTOR

(71) Applicant: NATIONAL TSING HUA UNIVERSITY, Hsinchu (TW)

(72) Inventors: Chih-Fang Huang, Hsinchu (TW); Yi-Chen Li, Taichung (TW); Ting-Fu Chang, Hsinchu (TW); Keh-Yung Cheng, Hsinchu (TW); Yu-Li Wang, Hsinchu (TW); Chun-Hung Wu, Hsinchu (TW); Wei-Chen Yang, Hsinchu (TW); Shao-Yen Chiu, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/587,818

(22) Filed: Dec. 31, 2014

(65) Prior Publication Data
US 2016/0190384 A1    Jun. 30, 2016

(51) Int. Cl.
*H01L 33/00* (2010.01)
*H01L 27/15* (2006.01)
*H01L 33/32* (2010.01)

(52) U.S. Cl.
CPC ............. *H01L 33/002* (2013.01); *H01L 27/15* (2013.01); *H01L 33/0041* (2013.01); *H01L 33/32* (2013.01)

(58) Field of Classification Search
CPC ... H01L 27/15; H01L 33/41; H01L 29/7787; H01L 25/167
USPC ........................................ 257/211, 76, 77, 94
See application file for complete search history.

(56) References Cited

U.S. PATENT DOCUMENTS

| | | |
|---|---|---|
| 2007/0267655 A1 | 11/2007 | Endoh et al. |
| 2009/0072267 A1* | 3/2009 | Goshonoo et al. ........... 257/103 |
| 2009/0121775 A1* | 5/2009 | Ueda et al. .................. 327/427 |
| 2010/0156475 A1 | 6/2010 | Simin et al. |
| 2011/0006346 A1* | 1/2011 | Ando et al. .................. 257/192 |
| 2011/0012110 A1* | 1/2011 | Sazawa et al. ................ 257/51 |
| 2011/0227033 A1 | 9/2011 | Kushibe et al. |
| 2013/0043485 A1 | 2/2013 | Ueno |

* cited by examiner

*Primary Examiner* — Cuong Q Nguyen
*Assistant Examiner* — Tong-Ho Kim
(74) *Attorney, Agent, or Firm* — Muncy, Geissler, Olds & Lowe, P.C.

(57) ABSTRACT

A structure of high electron mobility light emitting transistor comprises a substrate, a HEMT region disposed on the substrate, and a gallium nitride LED (GaN-LED) region disposed on the substrate. A two-dimensional electron gas layer is present in each of the HEMI region and the LED region, and the HEMT region is coupled to the LED region through the two-dimensional electron gas layer.

20 Claims, 6 Drawing Sheets

STRUCTURE OF HIGH ELECTRON MOBILITY LIGHT EMITTING TRANSISTOR

BACKGROUND OF THE INVENTION

1. Field of the Invention

The invention relates to a structure of high electron mobility light emitting transistor, and more particularly to a structure of high electron mobility transistor has a built-in LED.

2. Related Art

The aluminum gallium nitride/gallium nitride high electron mobility transistor (AlGaN/GaN HEMT) has extremely high superiority in the high-temperature, high-frequency and high power applications. In addition to the gallium nitride applied to the field effect transistor, the gallium nitride is also suitable for the application to the light emitting devices because of the property of the 3.4 eV direct bandgap of the gallium nitride. The wavelength ranges of the light outputted from the gallium nitride and its associated ternary compound are very wide and cover the green, blue or even UV light. So, the gallium nitride LED manufacturing process has been widely used.

SUMMARY OF THE INVENTION

An object of the invention is to provide a structure of high electron mobility light emitting transistor being a structure of a group III-V material transistor.

Another object of the invention is to provide a structure of high electron mobility light emitting transistor comprising a HEMT region and a gallium nitride LED (GaN-LED) region.

The invention provides a structure of high electron mobility light emitting transistor. The structure comprises a substrate, a HEMT region disposed on the substrate, and a LED region disposed on the substrate. A two-dimensional electron gas (2 DEG) layer is present in each of the HEMT region and the LED region. The HEMT region is coupled to the LED region through the 2 DEG layer.

DETAILED DESCRIPTION OF THE INVENTION

Figure 1:
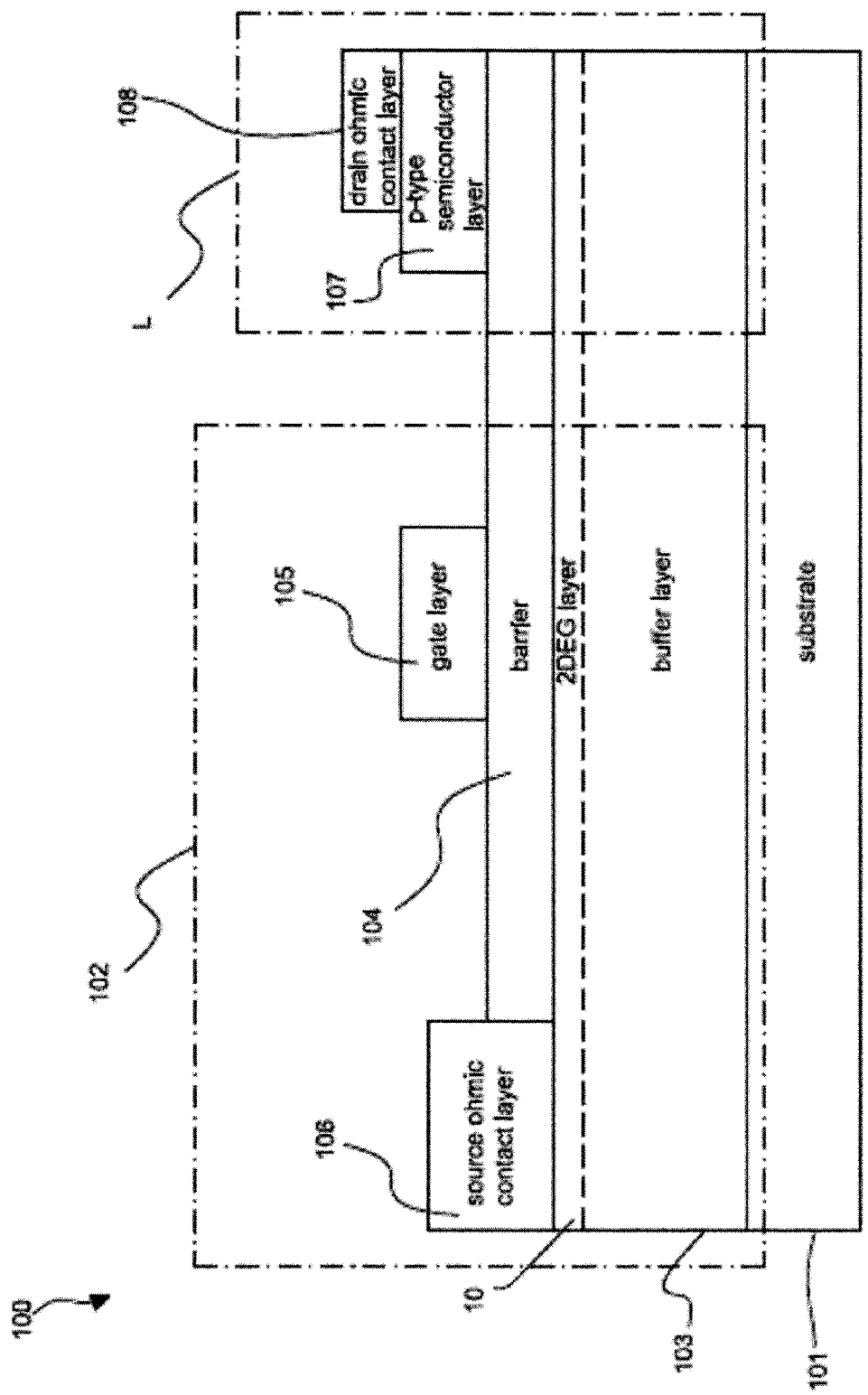
FIGS. 1 to 6 are schematic views each showing a structure of high electron mobility light emitting transistor according to an embodiment of the invention.

FIG. 1 is a schematic view showing a structure of high electron mobility light emitting transistor according to an embodiment of the invention. Referring to FIG. 1, the structure 100 comprises a substrate 101, a HEMT region 102 and a LED region L.

The HEMT region 102 is disposed on the substrate 101. The LED region L is also disposed on the substrate 101. In this embodiment, the substrate 101 may be implemented by a silicon (Si) substrate, or a sapphire substrate, or a gallium nitride (GaN) substrate, or a silicon carbide substrate.

The structure 100 comprises a buffer layer 103 and a barrier 104. The buffer layer 103 is disposed on the substrate 101. The barrier 104 is disposed on the buffer layer 103 and partially covers the buffer layer 103.

In this embodiment, the HEMT region 102 comprises a gate layer 105 and a source ohmic contact layer 106. The gate layer 105 is disposed on the barrier 104 and partially covers the barrier 104. The source ohmic contact layer 106 is disposed on the buffer layer 103. The source ohmic contact layer 106 partially covers the buffer layer 103 and contacts the barrier 104.

Correspondingly, the LED region L comprises a p-type semiconductor layer 107 and a drain ohmic contact layer 108. The p-type semiconductor layer 107 is disposed on the barrier 104 and partially covers the barrier 104. The drain ohmic contact layer 108 is disposed on the p-type semiconductor layer 107.

In one embodiment, the source ohmic contact layer 106 is implemented by an antimony aluminum nickel gold alloy (Ti/Al/Ni/Au), the gate layer 105 is implemented by a nickel gold alloy (Ni/Au) and p-type semiconductor layer 107 is implemented by GaN.

In addition, band gap of the buffer layer 103 is smaller than the barrier 104, the buffer layer 103 and the barrier 104 may also be implemented by a group III-V material (e.g., AlGaN/GaN/AlN), but the invention should not be restricted thereto. In this invention, the buffer layer 103 is implemented by the gallium nitride (GaN), and the barrier 104 is implemented by the aluminum gallium nitride ($Al_yGa_{1-y}N$), wherein y may be 0.25.

The material of the drain ohmic contact layer 108 is implemented by a metal or a metal oxide, such as a nickel gold alloy or an indium tin oxide (ITO). The gate layer 105 is disposed between the source ohmic contact layer 106 and the drain ohmic contact layer 108.

A two-dimensional electron gas (2 DEG) layer 10 is present in each of the HEMT region 102 and the LED region L. The HEMT region 102 of the structure 100 is coupled to the LED region 102 through the 2 DEG layer 10.

It is to be noted that the HEMT region 102 and the LED region L are disposed on the buffer layer 103, and the invention combines two semiconductor materials having different bandgaps between the barrier 104 and the buffer layer 103. So, the interface between the barrier 104 and the buffer layer 103 is formed with the 2 DEG layer 10 serving as a current path composed of the electron flow. In other words, the 2 DEG layer 10 of the invention can provide electrons, and the p-type semiconductor layer 107 provides holes, wherein the electrons and the holes are combined together to generate different wavelengths of light.

In addition, a voltage may be loaded through the gate layer 105 to cut off the current between the drain ohmic contact layer 108 and the source ohmic contact layer 106 and thus to control the brightness of the light source of the LED region L.

Figure 2:
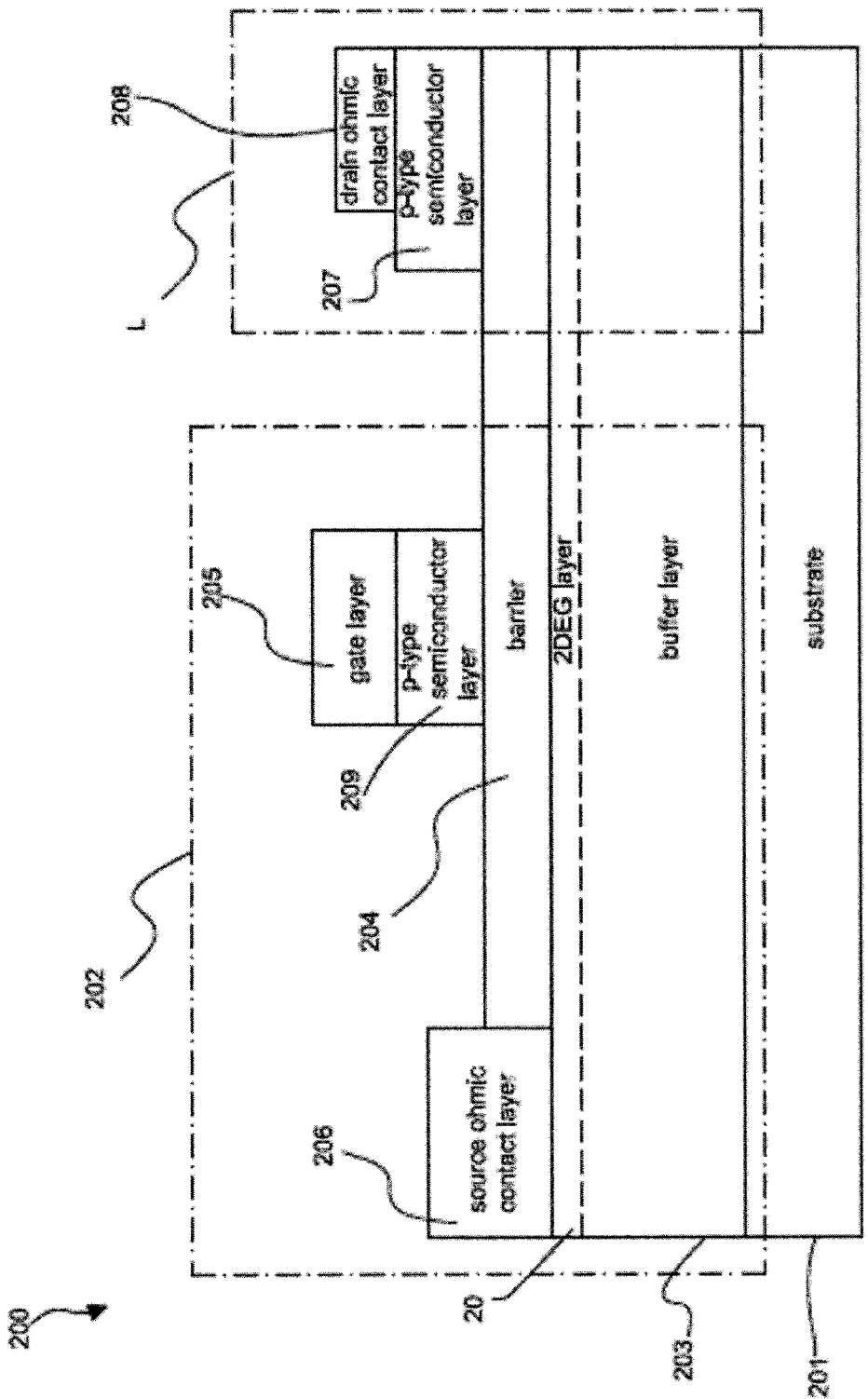

FIG. 2 is a schematic view showing a structure of high electron mobility light emitting transistor according to an embodiment of the invention. Referring to FIG. 2, the difference between the structures 200 and 100 resides in that the HEMT region 202 further comprises a p-type semiconductor layer 209, wherein the gate layer 205 covers the p-type semiconductor layer 209, and the p-type semiconductor layer 209 is disposed between the barrier 204 and the gate layer 205.

In this embodiment, the PN junction is formed between the p-type semiconductor layer 209 and the buffer layer 203, and the p-type semiconductor 209 depletes the electron concentration of the 2 DEG layer 20 to turn off the 2 DEG layer 20 and thus to implement an enhancement-mode (E-Mode) element.

Figure 3:
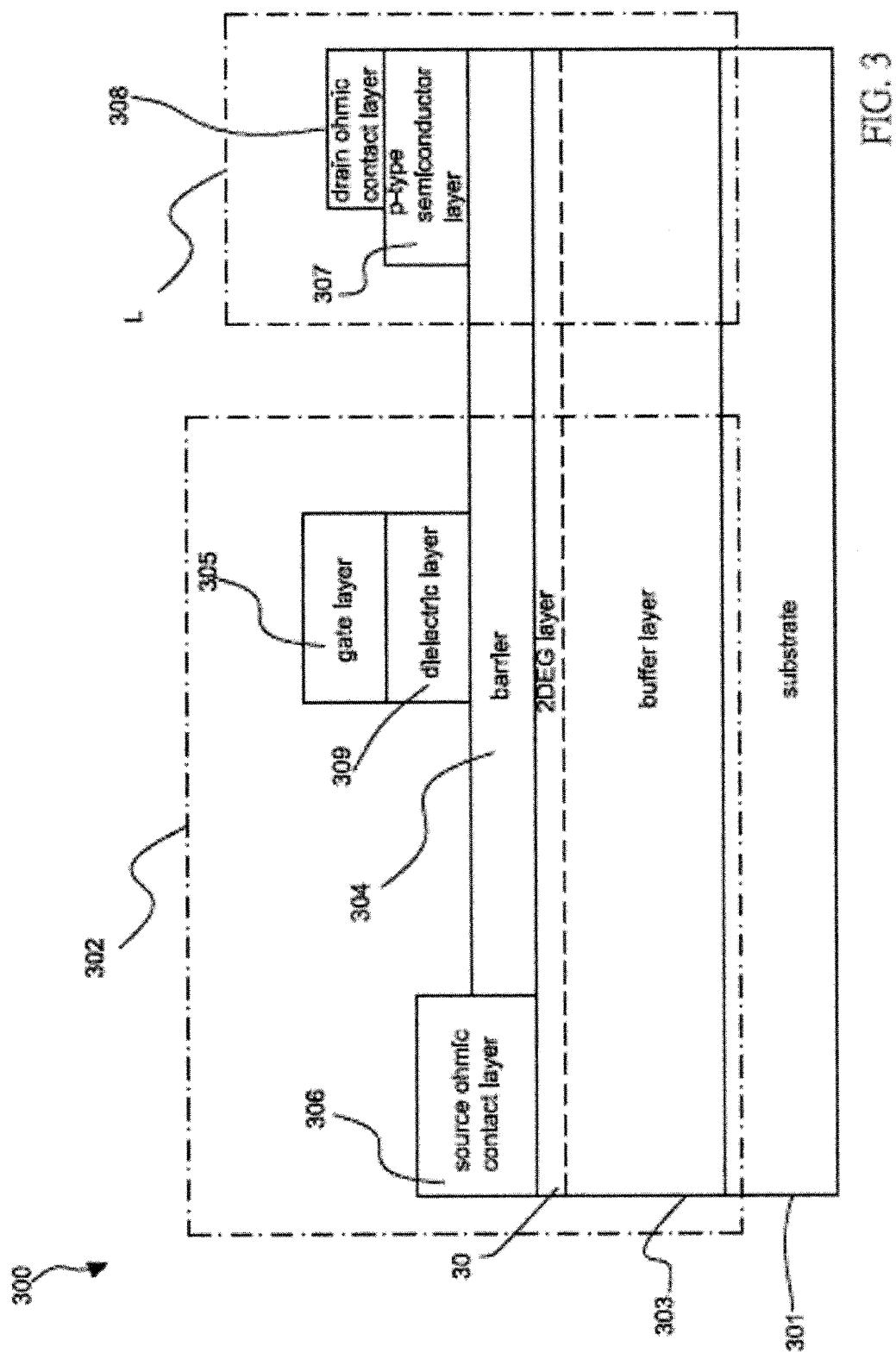

FIG. 3 is a schematic view showing a structure of high electron mobility light emitting transistor according to an embodiment of the invention. Referring to FIG. 3, the difference between the structures 300 and 100 resides in that the HEMT region 302 comprises a dielectric layer 309, which is disposed between the gate layer 305 and the barrier 304 and partially covers the barrier 304.

In this embodiment, when a voltage is given to the gate layer 305, the gate layer 305 utilizes the dielectric layer 309 to decrease the electron concentration of the 2 DEG layer 30 of the region covered by the dielectric layer 309 to implement a depletion mode (D-Mode) element.

Figure 4:
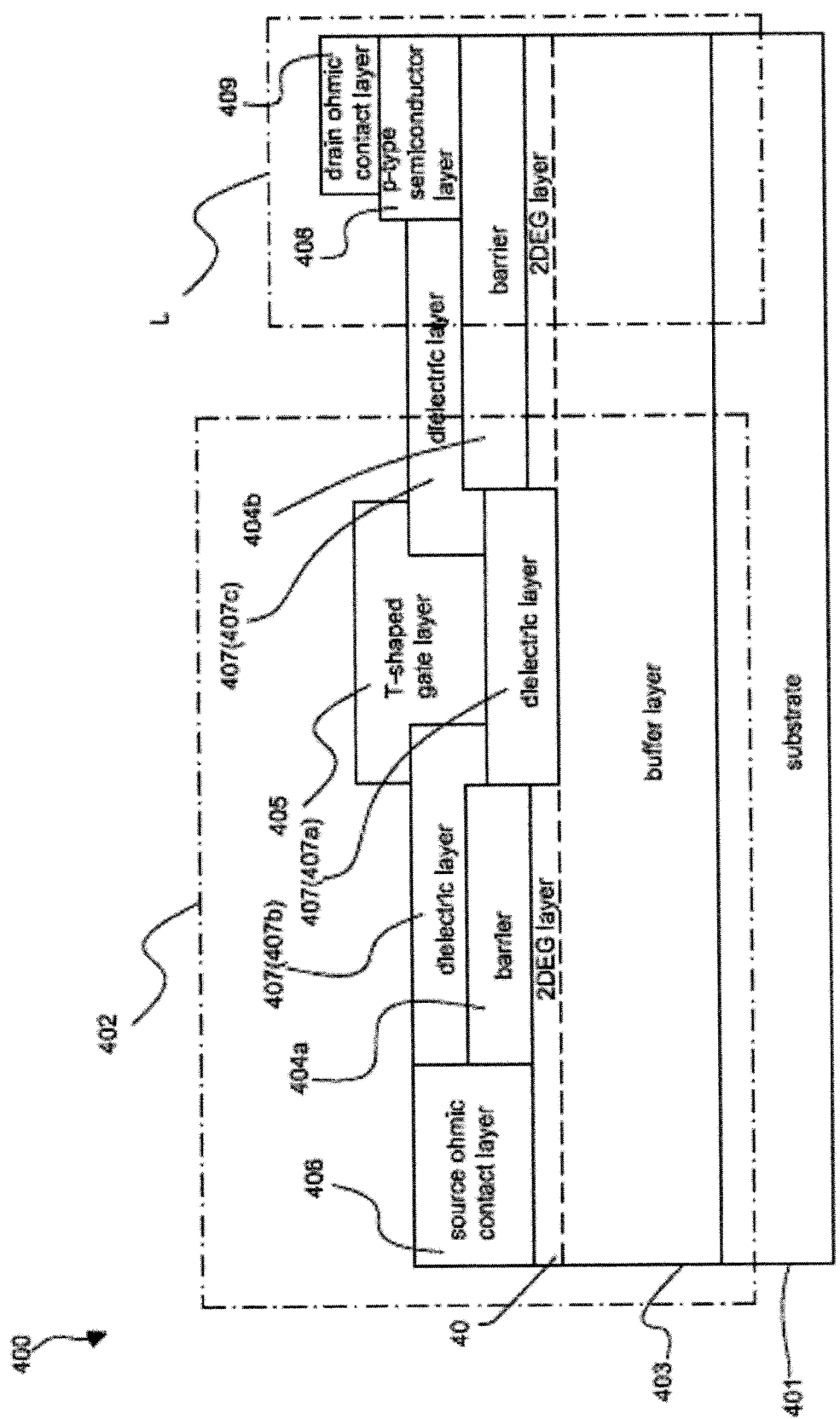

FIG. 4 is a schematic view showing a structure of high electron mobility light emitting transistor according to an embodiment of the invention. Referring to FIG. 4, similar to that described hereinabove, the structure 400 comprises a substrate 401, a HEMT region 402, a LED region L and a buffer layer 403.

The HEMT region 402 further comprises barriers 404a, 404b, a T-shaped gate layer 405, a source ohmic contact layer 406 and a dielectric layer 407. The LED region L comprises a p-type semiconductor layer 408 and a drain ohmic contact layer 409. The HEMT region 402 and the LED region L are disposed on the buffer layer 403, and a 2 DEG layer 40 is present between the buffer layer 403 and the barriers 404a, 404b.

The barriers 404a, 404b are disposed on two lateral sides of the dielectric layer 407, respectively. The barriers 404a, 404b are disposed on the buffer layer 403 and partially cover the buffer layer 403.

The dielectric layer 407 has portions 407a, 407b and 407c. The portion 407a is disposed on the buffer layer 403, the portion 407b covers the barrier 404a, and the portion 407c covers the barrier 404b.

The T-shaped gate layer 405 is disposed on the dielectric layer 407 and partially covers the portion 407a, the portion 407b and the portion 407c.

The source ohmic contact layer 406 is disposed on the buffer layer 403, partially covers the buffer layer 403 and contacts the barrier 404a and the portion 407b.

The p-type semiconductor layer 408 is disposed on the barrier 404b, and partially covers the barrier 404b. The drain ohmic contact layer 409 is disposed on the p-type semiconductor layer 408 and contacts the portion 407c.

As mentioned hereinabove, when a voltage is given to the T-shaped gate layer 405 in this embodiment, the T-shaped gate layer 405 utilizes the dielectric layer 407 to increase the electron concentration of the 2 DEG layer 40 of the region covered by the dielectric layer 407. At this time, the 2 DEG layer 40 is present in each of the dielectric layer 407 and the buffer layer 403 so as to implement the E-MO element. In other words, the T-shaped gate layer turns on a voltage or not to determine whether the 2 DEG layer 40 is present between the portion 407a and the buffer layer 403 or not. The other operation principles are the same as those described hereinabove, and will be omitted herein.

Figure 5:
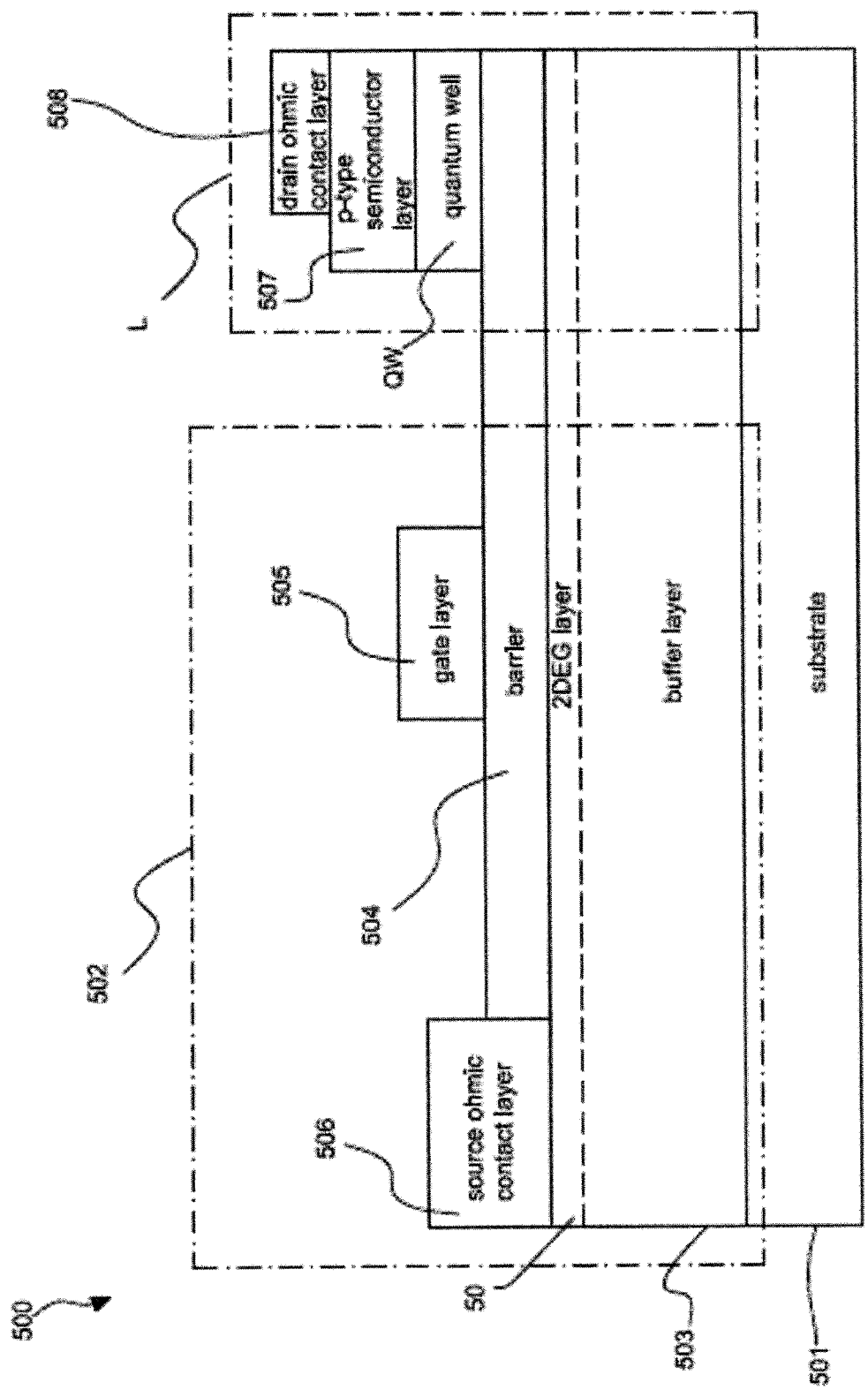

FIG. 5 is a schematic view showing a structure of high electron mobility light emitting transistor according to an embodiment of the invention. Referring to FIG. 5, the difference between the structures 500 and 100 resides in that the LED region L comprises a quantum well QW disposed between the barrier 504 and the p-type semiconductor layer 507.

In this embodiment, the structure 500 may also increase the recombination possibility of the electrons and holes through the multi-layer quantum well QW because the holes are restricted in the width range of the quantum well. By doing so, the light emitting efficiency of the LED region L and different bands of light waves may be increased, wherein the quantum well QW may be implemented by the indium gallium nitride/gallium nitride (InGaN/GaN).

Figure 6:
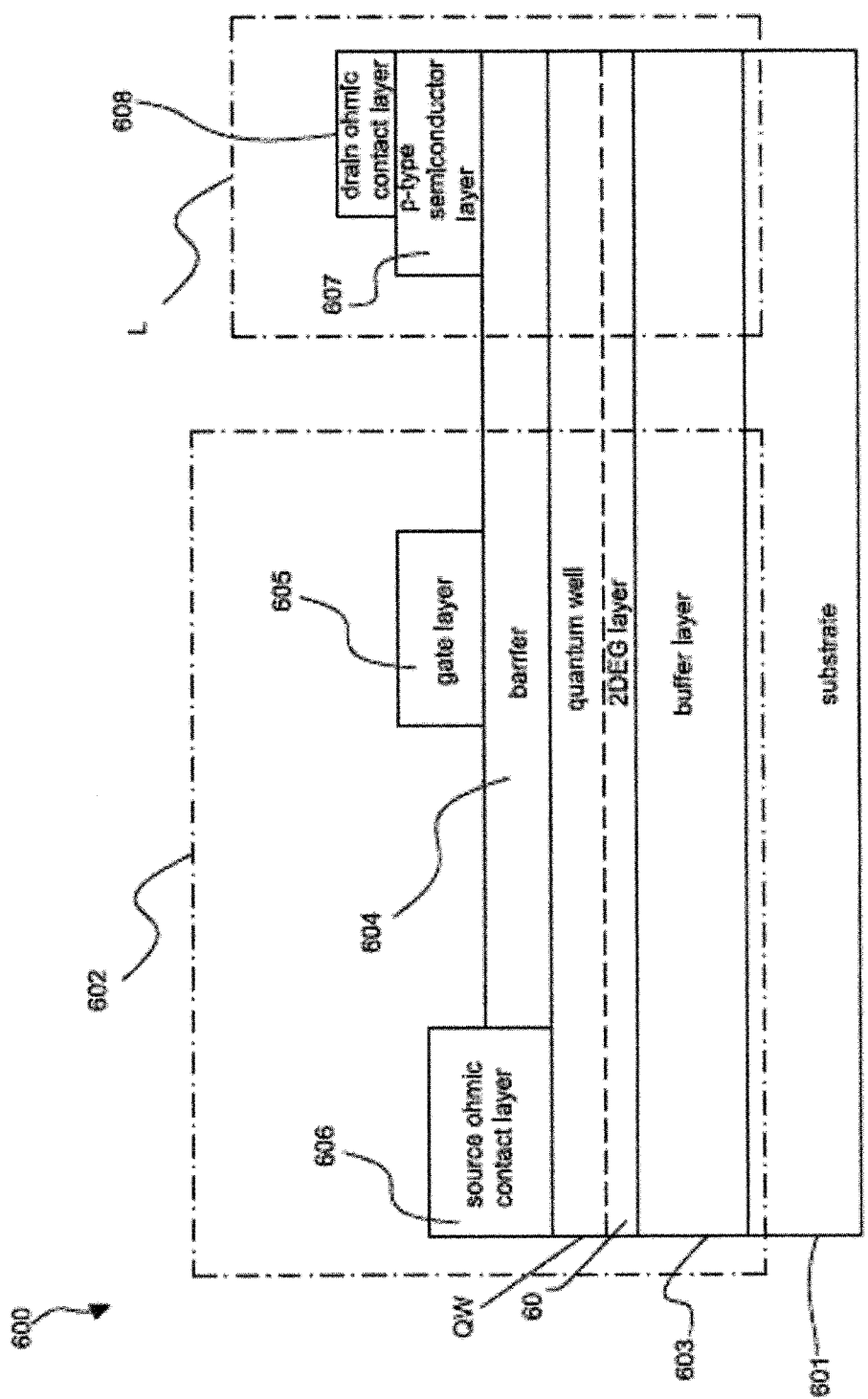

FIG. 6 is a schematic view showing a structure of high electron mobility light emitting transistor according to an embodiment of the invention. Referring to FIG. 6, the difference between the structures 600 and 100 resides in that the quantum well QW is disposed between the buffer layer 603 and the barrier 604 (as depicted by the thick border), and the 2 DEG layer 60 is also present between the buffer layer 603 and the barrier 604. In this embodiment, the 2 DEG layer 60 is present in the quantum well QW.

In summary, the invention utilizes the HEMI coupled to the LED through the 2 DEG layer, and controls the LED's light emitting intensity through the gate voltage to achieve the integral structure of the HEMT and the LED.

What is claimed is:

1. A structure of high electron mobility transistor (HEMT), the structure comprising:
   a substrate;
   a HEMT region disposed on the substrate; and
   a light-emitting region disposed on the substrate,
   wherein the light-emitting region does not have a n-type semiconductor layer on a barrier of the light-emitting region; a two-dimensional electron gas (2DEG) layer is present in each of the HEMT region and the light-emitting region, and the HEMT region is coupled to the light-emitting region through the 2DEG layer.

2. The structure according to claim 1, further comprising:
   a buffer layer disposed on the substrate;
   wherein the barrier disposed on the buffer layer and partially covering the buffer layer; and
   the HEMT region and the light-emitting region are disposed on the buffer layer, and the 2DEG layer is present between the buffer layer and the barrier.

3. The structure according to claim 2, wherein:
   the HEMT region comprises:
   a gate layer directly or indirectly disposed on the barrier and partially covering the barrier; and
   a source ohmic contact layer disposed on the buffer layer, partially covering the buffer layer and contacting the barrier; and
   the light-emitting region comprises:
   a p-type semiconductor layer disposed on the barrier and partially covering the barrier; and
   a drain ohmic contact layer disposed on the p-type semiconductor layer;
   wherein a material of the drain ohmic contact layer is a metal or a metal oxide, and the gate layer is disposed between the source ohmic contact layer and the drain ohmic contact layer.

4. The structure according to claim 2, wherein
   the structure further comprises a quantum well disposed between the buffer layer and the barrier;
   the HEMT region comprises:
   a gate layer disposed on the barrier; and
   a source ohmic contact layer disposed on the buffer layer and partially covering the buffer layer and contacting the barrier; and
   the light-emitting region comprises:
   a p-type semiconductor layer disposed on the barrier; and
   a drain ohmic contact layer disposed on the p-type semiconductor layer;
   wherein a material of the drain ohmic contact layer is a metal or a metal oxide, the gate layer is disposed between the source ohmic contact layer and the drain ohmic contact layer; and the 2DEG layer is present in the quantum well.

5. The structure according to claim 2, wherein:
   the HEMT region comprises:

a gate layer disposed on the barrier; and
a source ohmic contact layer disposed on the buffer layer, partially covering the buffer layer and contacting the barrier; and
the light-emitting region comprises:
a p-type semiconductor layer disposed on the barrier; and
a drain ohmic contact layer disposed on the p-type semiconductor layer;
wherein a material of the drain ohmic contact layer is a metal or a metal oxide, and the gate layer is disposed between the source ohmic contact layer and the drain ohmic contact layer.

6. The structure according to claim 2, wherein:
the HEMT region comprises:
a gate layer disposed on the barrier;
a dielectric layer disposed between the gate layer and the barrier and partially covering the barrier; and
a source ohmic contact layer disposed on the buffer layer and partially covering the buffer layer and contacting the barrier; and
the light-emitting region comprises:
a p-type semiconductor layer disposed on the barrier; and
a drain ohmic contact layer disposed on the p-type semiconductor layer;
wherein a material of the drain ohmic contact layer is a metal or a metal oxide, and the gate layer is disposed between the source ohmic contact layer and the drain ohmic contact layer.

7. The structure according to claim 2, wherein:
the HEMT region comprises:
a first barrier disposed on and covering the buffer layer;
a second barrier disposed on and covering the buffer layer;
a dielectric layer having a first portion, a second portion and a third portion, wherein the first portion is disposed on the buffer layer and the second portion and the third portion cover the first barrier and the second barrier, respectively;
a T-shaped gate layer disposed on the dielectric layer and partially covering the first portion, the second portion and the third portion; and
a source ohmic contact layer disposed on the buffer layer, wherein the source ohmic contact layer partially covers the buffer layer and contacts the first barrier and the second portion; and
the light-emitting region comprises:
a p-type semiconductor layer disposed on the barrier; and
a drain ohmic contact layer disposed on the p-type semiconductor layer and the p-type semiconductor contacts the third portion;
wherein a material of the drain ohmic contact layer is a metal or a metal oxide, and the gate layer is disposed between the source ohmic contact layer and the drain ohmic contact layer.

8. The structure according to claim 7, wherein the T-shaped gate layer turns on a voltage or not to determine whether the 2DEG layer is present between the first portion and the buffer layer or not.

9. The structure according to claim 2, wherein:
the HEMT region comprises:
a gate layer disposed on the barrier; and
a source ohmic contact layer disposed on the buffer layer and partially covering the buffer layer and contacting the barrier; and
the light-emitting region comprises:
a quantum well disposed on the barrier;
a p-type semiconductor layer disposed on the quantum well; and
a drain ohmic contact layer disposed on the p-type semiconductor layer;
wherein a material of the drain ohmic contact layer is a metal or a metal oxide, and the gate layer is disposed between the source ohmic contact layer and the drain ohmic contact layer.

10. A structure of high electron mobility transistor (HEMT), the structure comprising:
a substrate;
a HEMT region disposed on the substrate; and
a light-emitting region disposed on the substrate; and
a barrier disposed in the light-emitting region;
wherein there is not any n-type semiconductor layer on the barrier of the light-emitting region; a two-dimensional electron gas (2DEG) layer is present in each of the HEMT region and the light-emitting region, and the HEMT region is coupled to the light-emitting region through the 2DEG layer.

11. The structure according to claim 10, further comprising:
a buffer layer disposed on the substrate;
the barrier disposed on the buffer layer and partially covering the buffer layer; and
the HEMT region comprises:
a gate layer directly or indirectly disposed on the barrier and partially covering the barrier; and
a source ohmic contact layer disposed on the buffer layer, partially covering the buffer layer and contacting the barrier; and
the light-emitting region comprises:
a p-type semiconductor layer disposed on the barrier and partially covering the barrier; and
a drain ohmic contact layer disposed on the p-type semiconductor layer;
wherein a material of the drain ohmic contact layer is a metal or a metal oxide, and the gate layer is disposed between the source ohmic contact layer and the drain ohmic contact layer.

12. The structure according to claim 10, further comprising:
a buffer layer disposed on the substrate;
the barrier disposed on the buffer layer and partially covering the buffer layer;
a quantum well disposed between the buffer layer and the barrier; and
the HEMT region comprises:
a gate layer disposed on the barrier; and
a source ohmic contact layer disposed on the buffer layer and partially covering the buffer layer and contacting the barrier; and
the light-emitting region comprises:
a p-type semiconductor layer disposed on the barrier; and
a drain ohmic contact layer disposed on the p-type semiconductor layer;
wherein a material of the drain ohmic contact layer is a metal or a metal oxide, the gate layer is disposed between the source ohmic contact layer and the drain ohmic contact layer; and
the 2DEG layer is present in the quantum well.

13. The structure according to claim 10, further comprising:
a buffer layer disposed on the substrate;
the barrier disposed on the buffer layer and partially covering the buffer layer; and
the HEMT region comprises:
a first barrier disposed on and covering the buffer layer;
a second barrier disposed on and covering the buffer layer;

a dielectric layer having a first portion, a second portion and a third portion, wherein the first portion is disposed on the buffer layer and the second portion and the third portion cover the first barrier and the second barrier, respectively;

a T-shaped gate layer indirectly disposed on the buffer layer and partially covering the first portion, the second portion and the third portion; and a source ohmic contact layer disposed on the buffer layer, wherein the source ohmic contact layer partially covers the buffer layer and contacts the first barrier and the second portion; and the light-emitting region comprises:

a p-type semiconductor layer disposed on the barrier; and a drain ohmic contact layer disposed on the p-type semiconductor layer and the p-type semiconductor contacts the third portion;

wherein a material of the drain ohmic contact layer is a metal or a metal oxide, and the gate layer is disposed between the source ohmic contact layer and the drain ohmic contact layer.

14. The structure according to claim 10, wherein:
a buffer layer disposed on the substrate;
the barrier disposed on the buffer layer and partially covering the buffer layer; and
the HEMT region comprises:
a gate layer disposed on the barrier; and
a source ohmic contact layer disposed on the buffer layer and partially covering the buffer layer and contacting the barrier; and
the light-emitting region comprises:
a quantum well disposed on the barrier;
a p-type semiconductor layer disposed on the quantum well; and
a drain ohmic contact layer disposed on the p-type semiconductor layer;
wherein a material of the drain ohmic contact layer is a metal or a metal oxide, and the gate layer is disposed between the source ohmic contact layer and the drain ohmic contact layer.

15. A structure of high electron mobility transistor (HEMT), the structure comprising:
a substrate;
a HEMT region disposed on the substrate;
a light-emitting region disposed on the substrate; and
a barrier disposed on a buffer layer and partially covering the buffer layer;
wherein a light is generated under the barrier; a two-dimensional electron gas (2DEG) layer is present in each of the HEMT region and the light-emitting region, and the HEMT region is coupled to the light-emitting region through the 2DEG layer.

16. The structure according to claim 15, wherein:
there is no any n-type semiconductor layer on the barrier of the light-emitting region.

17. The structure according to claim 16, further comprising:
a buffer layer disposed on the substrate;
the barrier disposed on the buffer layer and partially covering the buffer layer; and
the HEMT region comprises:
a gate layer directly or indirectly disposed on the barrier and partially covering the barrier; and
a source ohmic contact layer disposed on the buffer layer, partially covering the buffer layer and contacting the barrier; and
the light-emitting region comprises:

a p-type semiconductor layer disposed on the barrier and partially covering the barrier; and
a drain ohmic contact layer disposed on the p-type semiconductor layer;
wherein a material of the drain ohmic contact layer is a metal or a metal oxide, and the gate layer is disposed between the source ohmic contact layer and the drain ohmic contact layer.

18. The structure according to claim 16, further comprising:
a buffer layer disposed on the substrate;
the barrier disposed on the buffer layer and partially covering the buffer layer;
a quantum well disposed between the buffer layer and the barrier; and
the HEMT region comprises:
a gate layer disposed on the barrier; and
a source ohmic contact layer disposed on the buffer layer and partially covering the buffer layer and contacting the barrier; and
the light-emitting region comprises:
a p-type semiconductor layer disposed on the barrier; and
a drain ohmic contact layer disposed on the p-type semiconductor layer;
wherein a material of the drain ohmic contact layer is a metal or a metal oxide, the gate layer is disposed between the source ohmic contact layer and the drain ohmic contact layer; and the 2DEG layer is present in the quantum well.

19. The structure according to claim 16, further comprising:
a buffer layer disposed on the substrate;
the barrier disposed on the buffer layer and partially covering the buffer layer; and
the HEMT region comprises:
a first barrier disposed on and covering the buffer layer;
a second barrier disposed on and covering the buffer layer;
a dielectric layer having a first portion, a second portion and a third portion, wherein the first portion is disposed on the buffer layer and the second portion and the third portion cover the first barrier and the second barrier, respectively;
a T-shaped gate layer indirectly disposed on the buffer layer and partially covering the first portion, the second portion and the third portion; and
a source ohmic contact layer disposed on the buffer layer, wherein the source ohmic contact layer partially covers the buffer layer and contacts the first barrier and the second portion; and
the light-emitting region comprises:
a p-type semiconductor layer disposed on the barrier; and
a drain ohmic contact layer disposed on the p-type semiconductor layer and the p-type semiconductor contacts the third portion;
wherein a material of the drain ohmic contact layer is a metal or a metal oxide, and the gate layer is disposed between the source ohmic contact layer and the drain ohmic contact layer.

20. The structure according to claim 16, wherein:
a buffer layer disposed on the substrate;
the barrier disposed on the buffer layer and partially covering the buffer layer; and
the HEMT region comprises:
a gate layer disposed on the barrier; and
a source ohmic contact layer disposed on the buffer layer and partially covering the buffer layer and contacting the barrier; and the light-emitting region comprises:
a quantum well disposed on the barrier;
a p-type semiconductor layer disposed on the quantum well; and
a drain ohmic contact layer disposed on the p-type semiconductor layer;
wherein a material of the drain ohmic contact layer is a metal or a metal oxide, and the gate layer is disposed between the source ohmic contact layer and the drain ohmic contact layer.

* * * * *